US009748895B2

(12) United States Patent
Mariotto et al.

(10) Patent No.: US 9,748,895 B2
(45) Date of Patent: Aug. 29, 2017

(54) SOLAR MODULE WITH SIMPLIFIED HUMIDITY LEVEL REGULATION

(71) Applicants: Commissariat a l'energie atomique et aux energies alternatives, Paris (FR); HELIOTROP, Lyons (FR)

(72) Inventors: Mathieu Mariotto, La Motte-Servolex (FR); Mathieu Baudrit, Chambery (FR); Paul Bellavoine, Paris (FR); Jean Edouard De Salins, Paris (FR); Florian Degabriel, Fontaine (FR); Philippe Laferriere, Paris (FR)

(73) Assignees: Commissariat à l'ènergie atomique et aux énergies alternatives, Paris (FR); HELIOTROP, Lyons (FR)

( * ) Notice: Subject to any disclaimer, the term of this patent is extended or adjusted under 35 U.S.C. 154(b) by 23 days.

(21) Appl. No.: 14/901,135

(22) PCT Filed: Jun. 26, 2014

(86) PCT No.: PCT/EP2014/063591
§ 371 (c)(1),
(2) Date: Dec. 28, 2015

(87) PCT Pub. No.: WO2014/207141
PCT Pub. Date: Dec. 31, 2014

(65) Prior Publication Data
US 2016/0156306 A1      Jun. 2, 2016

(30) Foreign Application Priority Data

Jun. 26, 2013   (FR) ..................... 13 56157

(51) Int. Cl.
*H01L 31/0232*       (2014.01)
*H02S 40/10*         (2014.01)
(Continued)

(52) U.S. Cl.
CPC ........ *H02S 40/10* (2014.12); *H01L 31/02325* (2013.01); *H01L 31/048* (2013.01);
(Continued)

(58) Field of Classification Search
CPC ........ H02S 40/10; H02S 40/425; H02S 40/22; H01L 31/048; H01L 31/052; H01L 31/05453; H01L 31/02325
(Continued)

(56) References Cited

U.S. PATENT DOCUMENTS 4,633,032 A     12/1986   Oido et al.
5,384,653 A     1/1995    Benson et al.
(Continued)

FOREIGN PATENT DOCUMENTS

EP         2 088 631 A1       8/2009
WO     WO 2008/045187 A2     4/2008
(Continued)

OTHER PUBLICATIONS

International Search Report and Written Opinion issued Oct. 20, 2014 in PCT/EP2014/063591 (with English language translation).
(Continued)

*Primary Examiner* — Jayne Mershon
(74) *Attorney, Agent, or Firm* — Oblon, McClelland, Maier & Neustadt, L.L.P.

(57) ABSTRACT

A solar module in a concentrating solar system including: a box including a top wall, formed from an optical system, and walls; at least one photovoltaic cell placed in the box; and at least one humidity management device. At least one first wall among the walls includes a principal part contained in a plane. The humidity management device includes a housing defined between the first wall and a cover fixed to the first wall including an occultation part and an inner part forming an air film at the occultation part. A moisture-
(Continued)

absorbing material is placed in the housing, at least part of the moisture-absorbing material is located on one side of the plane containing the occultation part.

19 Claims, 9 Drawing Sheets

(51) Int. Cl.
*H01L 31/048* (2014.01)
*H01L 31/052* (2014.01)
*H01L 31/054* (2014.01)
*H02S 40/42* (2014.01)
*H02S 40/22* (2014.01)

(52) U.S. Cl.
CPC ........ *H01L 31/052* (2013.01); *H01L 31/0543* (2014.12); *H02S 40/22* (2014.12); *H02S 40/425* (2014.12); *Y02E 10/52* (2013.01)

(58) Field of Classification Search
USPC ........................................................ 136/259
See application file for complete search history.

(56) References Cited

U.S. PATENT DOCUMENTS

| | | |
|---|---|---|
| 2008/0000195 A1 | 1/2008 | Clarahan |
| 2009/0173376 A1 | 7/2009 | Spencer et al. |
| 2011/0154683 A1 | 6/2011 | Vogt et al. |
| 2012/0031465 A1 | 2/2012 | Battistutti |
| 2013/0036909 A1* | 2/2013 | Menard ................ B01D 53/261 95/91 |
| 2015/0136201 A1 | 5/2015 | Mariotto et al. |

FOREIGN PATENT DOCUMENTS

| | | |
|---|---|---|
| WO | WO 2009/063102 A1 | 5/2009 |
| WO | WO 2009/080847 A1 | 7/2009 |
| WO | WO 2010/128181 A1 | 11/2010 |
| WO | WO 2011/085086 A2 | 7/2011 |

OTHER PUBLICATIONS

Preliminary Search Report issued Feb. 27, 2014 in French Patent Application No. FR 1356157 (with English Translation of Category of Cited Documents).

\* cited by examiner

SOLAR MODULE WITH SIMPLIFIED HUMIDITY LEVEL REGULATION

TECHNICAL DOMAIN AND PRIOR ART

This invention relates to a solar module with simplified humidity level regulation.

Concentrating photovoltaic systems have developed strongly due to the significant increase in the efficiency of triple junction cells that they use to convert concentrated solar energy into electrical energy.

A concentrating photovoltaic system comprises modules composed of a box for which the upper bottom is composed of one or several Fresnel lenses that concentrate the incident solar flux and the lower bottom acts as a support for one or several photovoltaic cells. The system comprises a mobile frame called a tracker on which one or several modules is (are) mounted; the frame moves to follow the trajectory of the sun such that the solar rays are always perpendicular to the lenses.

Direct solar radiation is concentrated by the lenses and is sent to photovoltaic cells that convert it into electrical energy.

Radiation from lenses towards the clear night sky significantly reduces the temperature of the lenses, causing the appearance of a first drop of liquid water when it drops below the dew temperature of air contained in the box. Lenses have a serrated microstructure on their inner face that is the preferred seat for the liquid condensation mechanism and for trapping the condensate formed.

Therefore, a film of liquid or solid water forms on the inside surface of the lenses, which prevents electricity production because there is zero direct radiation; therefore, the global efficiency of the system is strongly degraded. Furthermore, there is a risk of corrosion of electrical components and other degradation modes of materials in the module by the condensate; the life and reliability of the system are then significantly reduced.

Furthermore, the increasing concentration factor of systems, for example 1000 times the brightness of the sun or even more, implies a non-negligible focal distance and a large box size, which creates a large air volume per $m^2$ of lenses that makes management of the occurrence of condensation more difficult.

Various solutions have been proposed to solve this condensation problem.

One of these solutions is disclosed in document US 2011/0154683.

This document describes a device to dry the inside of a solar module. This device is located outside the box and it is connected to the box to enable air circulation between the outside environment and the inside of the box.

The device comprises a fan that draws in air from the outside, this air passes through a humidity absorber, and the air thus dried is introduced into the solar module. The absorber is regenerated by pre-heated air passing through it, this air then being discarded to the outside environment.

This solution has the disadvantage of consuming electrical energy and requires maintenance of the fan, heating means and solenoid valves.

PRESENTATION OF THE INVENTION

Consequently, one purpose of this invention is to provide a solar module of a concentrating photovoltaic system comprising a device for control of the humidity with a simple and robust design providing long life, that does not consume electrical energy for its operation and having a small number of parts.

The previously mentioned purpose is achieved by a solar module comprising a box and at least one photovoltaic cell placed in the box, the top wall of the box being at least partly composed of an optical system. The box defines an inner volume inside which the photovoltaic cell is located, the module also comprising at least one management device comprising a material to absorb humidity placed in or on a wall of the box.

An occultation element protecting the moisture-absorbing material from concentrated solar radiation if the solar module loses its focus is placed facing the moisture-absorbing material so as to form a passage between the occultation element and the moisture-absorbing material. Air contained in the volume of the box circulates between the occultation element and the moisture-absorbing material.

Natural convection occurs due to the development of a temperature gradient between the lenses (the temperature of which drops during the night due to radiation towards the night sky) and the lower part of the box that does not radiate towards the sky.

Air passing in the space between the moisture-absorbing material and the occultation element contains water vapour. The absorbing material absorbs water vapour, such that the content of water vapour in the air at the outlet is lower.

The device is entirely passive, it does not require any energy input and therefore, it does not degrade the global energy efficiency of the system. It is also self-contained and very robust. The absorbing material is also protected from the concentrated flux.

Therefore, it has a long life. It requires very little or no maintenance that is usually complex and expensive for this system, that is often installed in isolated zones. Finally, the cost price of this device is low.

Considering the position of the solar module during the night, (in the tracker safety position), it is preferable to install the device comprising the absorbing material such that the active surface of the medium is in the same plane as the plane in which natural convection movements develop due to temperature gradients inside the box, for example the humidity management device is installed in or on the lower bottom of the box.

Thermal insulation means may advantageously be provided between the moisture-absorbing material and the box and/or between the moisture-absorbing material and the occultation element.

Advantageously the material is humidity-regulating, and it can thus maintain a given degree of humidity within the box.

In one preferred embodiment, there is no direct communication between the humidity management device and the outside environment through the box.

The subject-matter of the invention is thus a concentrating solar module comprising a box including an upper bottom formed from an optical system, and walls, at least one photovoltaic cell placed in the box, and at least one humidity management device, at least one first wall among said walls comprising a principal part contained in a plane, said humidity management device comprising a housing defined between said first wall and occultation means fixed to said first wall, a moisture-absorbing material placed in said housing, at least a part of the moisture-absorbing material being located on one side of said plane containing the occultation means.

The occultation means are arranged relative to the moisture-absorbing material so as to leave a passage between said occultation means and the moisture-absorbing material, such that air contained in the box volume circulates in the passage between the occultation means and the moisture-absorbing material and returns into the volume of the box.

In one example embodiment, the housing is defined by the principal part of said first wall, the moisture-absorbing material being entirely located on the same side of the plane.

In another example embodiment, the first wall comprises a part formed by a depression, said depression combined with the occultation means defining said housing, the moisture-absorbing material being partly contained in said depression. The depression is advantageously made by stamping.

In one example embodiment, the box may comprise at least one side wall and a lower bottom opposite the upper bottom, the first wall being formed by the lower bottom.

In another example embodiment, the box comprises side walls and a lower bottom opposite the upper bottom, the first wall being formed by one of said side walls.

The humidity management device may comprise a cover supporting the occultation means, the occultation means being at least formed by an occultation plate.

Advantageously, the cover comprises attachment parts fixing the occultation plate to the first wall, the occultation plate being solid and said attachment parts being perforated to enable an air flow to be set up between the occultation plate and the moisture-absorbing material.

Preferably, the cover comprises at least one occultation plate that will collect the solar flux and an inner part facing the storage material, a space being arranged between said inner part and said occultation plate.

A thermal insulation material other than air may be provided between the occultation part and the inner part.

The inner part may advantageously be perforated so as to allow air located in the space between the inner part and the occultation plate to come into contact with the moisture-absorbing material.

In one advantageous example, the inner part is designed so that it applies a force on the storage material towards the first side wall.

For example, the inner part is formed from strips fixed at a longitudinal end to the occultation plate and bearing in contact with the moisture-absorbing material.

Very advantageously, the occultation plate, the inner part and the attachment parts are made from a single piece.

The attachment parts may also form means of retaining the moisture-absorbing material.

A thermal insulation material may be provided between the moisture-absorbing material and the retaining means and/or between the moisture-absorbing material and the first wall.

The distance between the first wall of the housing and an inner face of the inner part may be equal to at least 2 mm and the free air passage area may be equal to at least 10% of the product of an active width of the moisture-absorbing material and the distance between the part of the first wall of the housing and an inner face of the cover.

BRIEF DESCRIPTION OF THE DRAWINGS

This invention will be better understood after reading the following description and the appended drawings in which.

DETAILED PRESENTATION OF PARTICULAR EMBODIMENTS

Figure 1:
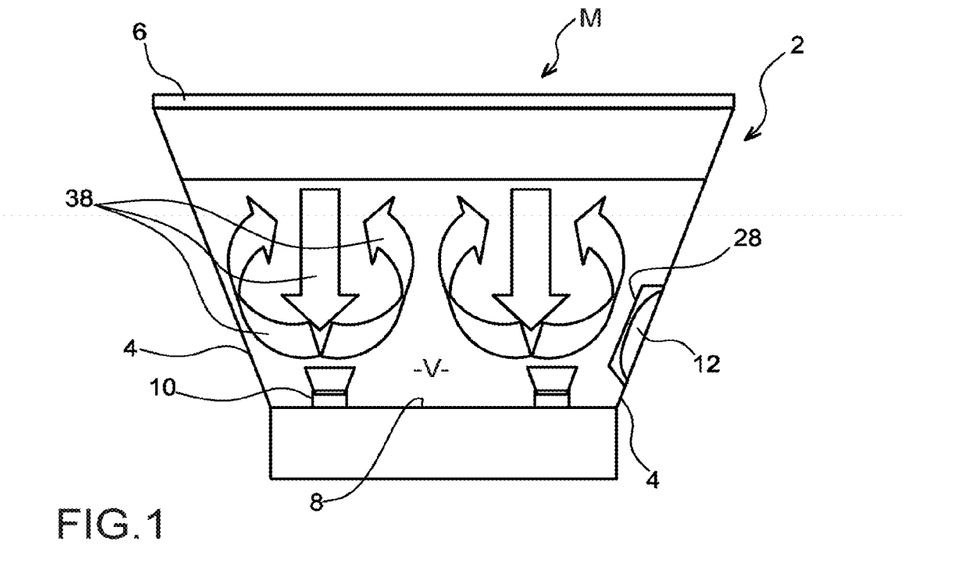
FIG. 1 is a diagrammatic cross-sectional view of an example embodiment of a unit module of a concentrating system in which a humidity management device according to a first embodiment of the invention is installed.

FIG. 1 shows a diagrammatic illustration of an example of a unit module M, according to the invention for a Fresnel lens concentrating system comprising a box 2 composed of a side wall 4, a top wall 6 and a lower bottom 8.

The top wall 6 is composed of a primary optics comprising one or more Fresnel lenses. The lower bottom 8 supports photovoltaic cells 10 for example of the triple junction type. Each lens focuses onto a photovoltaic cell 10. Preferably, the photovoltaic cell(s) 10 is (are) provided with heat sinks facing the outside of the lower bottom 8.

The side wall 4, the top wall 6 and the lower bottom 8 delimit a volume V containing air for which the moisture content is to be controlled.

The module M also comprises a humidity management device inside the box. The device is mounted on the side wall 4 of the box 2 inside the box 2.

The humidity management device, referred to as the management device throughout the remainder of this description, comprises a moisture-absorbing material 12 that is in contact with air contained in the volume V.

The absorbing material may for example be located inside a flexible container, called the <<bag>> that will be described in detail below.

Figure 2A:
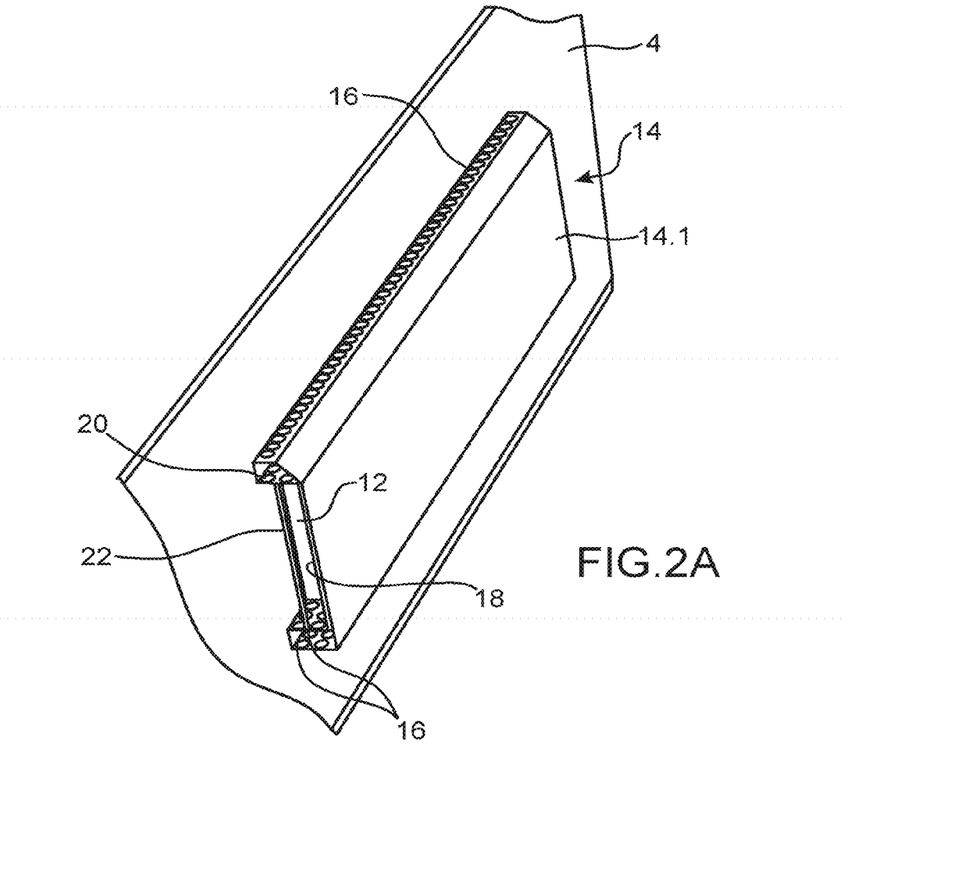
FIG. 2A is a perspective view of the humidity management device in FIG. 1 on the side wall.
Figure 2B:
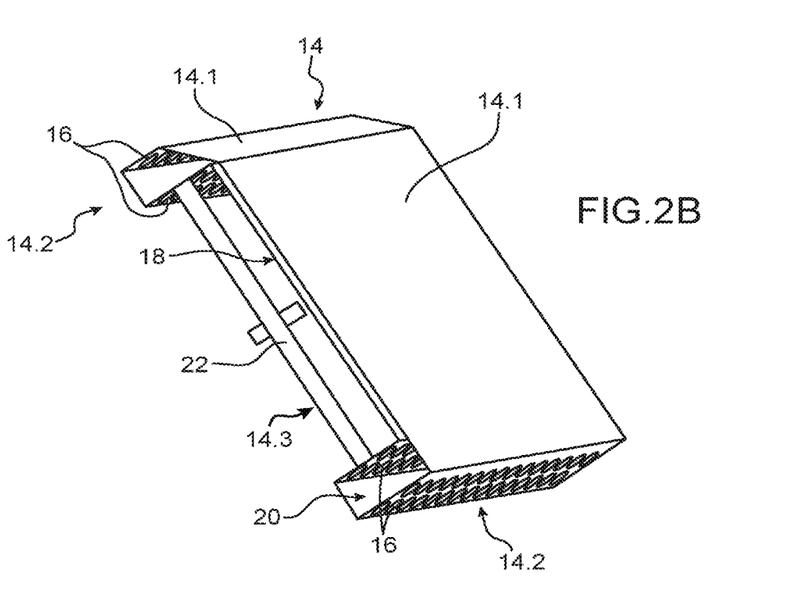
FIG. 2B is a perspective view of the humidity management device alone.
Figure 2C:
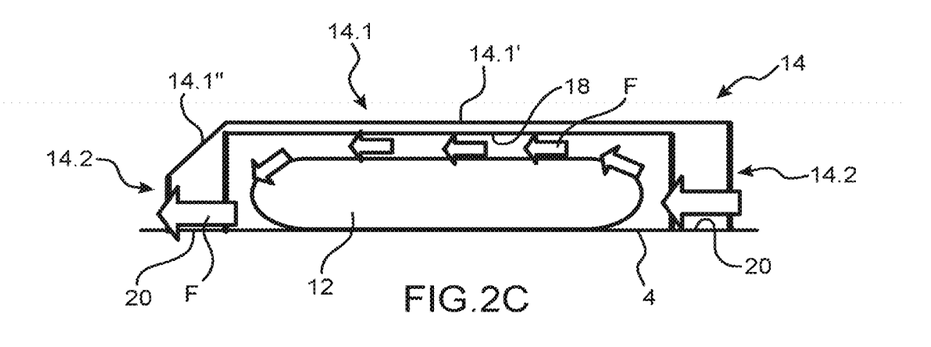
FIG. 2C is a longitudinal sectional view of the humidity management device in FIGS. 2A and 2B in a different orientation.

FIGS. 2A, 2B and 2C show an example embodiment of the management device.

The management device comprises a cover 14 fixed on the side wall 4 of the box delimiting a housing with the side wall 4 of the box, in which the absorbing material fits.

The cover 14 comprises an occultation part 14.1 approximately parallel to the box and attachment parts 14.2 designed to fix the cover 14 onto the box.

The dimensions of the cover 14 are such that a non-zero distance is formed between the absorbing material 12 and the occultation part 14.1. The occultation part 14.1 is solid and is designed to protect the absorbing material from concentrated solar rays, for example if focussing is lost, to prevent deterioration or to prevent the absorbing material from being unable to perform its function due to burning or overheating.

In the example shown, the occultation part 14.1 has a part 14.1' with a large surface area approximately parallel to the side wall and an inclined part 14.1" prolonging the protection of the material. This inclined part provides the same protection as a plane part extending over the same length while being more compact.

In the example shown, the attachment parts are located at the bottom and top longitudinal ends of the cover, assuming the direction of circulation of the air flow symbolised by the arrow F.

The attachment parts 14.2, apart from their function to fix the cover onto the side wall, are made so as to set up an air flow between the cover and the absorbing material; this air flow is symbolised by the arrows F and circulates from the lower bottom of the control box towards its top wall.

The air flow is caused by natural convection that is diagrammatically represented by the arrows 38 in FIG. 1.

The attachment parts 14.2 are then perforated to enable air flow. In the example shown, holes 16 are made in the attachment parts. It will be understood that the attachment parts could be made differently to make the communication between the occultation part and the box and to allow the passage of air. As a variant, they could comprise windows or they could be formed by racks. In the example shown, the number of holes at the outlet attachment part is smaller than the number at the inlet attachment part, but this is in no way limitative. The number of holes and/or the cross-sectional passage of these holes may be identical or may be higher without going outside the scope of this invention.

In one preferred embodiment, there is no communication between the humidity management device and the outside environment, more particularly the zone of the side wall 4 defining the housing of the absorbing material does not include any orifice enabling air transfer between the outside and the inside of the humidity management device. Air exchanges with the humidity management device, more particularly with the space defined between the side wall and the cover, are then made only with the inside of the box by natural convection as will be described below.

Preferably, surfaces directly facing the absorbing material have perforated zones representing at least 30% of the total facing surface areas. As will be seen later, elements may be in contact with the surface of the absorbing material opposite the surface in contact with the box, these elements advantageously have perforated zones and are parts facing the absorbing material.

Advantageously, the occultation part and the attachment parts are made in a single-piece by bending a plate.

Particularly advantageously and as shown, the cover is made so as to provide sufficient thermal insulation considering the temperature rise of the cover imposed by the solar flux. The cover then has a double wall at least in the occultation part. In particular, the cover comprises an inner part 18 parallel to and at a distance from the occultation part. An air film present between the occultation part 14.1 and the inner part 18 provides thermal insulation for the inner part 18. Thus, if the material comes into contact with the inner part, it would still be protected from an excessive temperature. A thermal insulation material other than air could be used between the occultation part 14.1 and the inner part 18. The thermal insulation material may for example be chosen among the family of polymer foams or the family of mineral wools.

Preferably, the minimum distance between the occultation part 14.1 and the inner part 18 to prevent the transmission of heat flux to the absorbing material is at least 1 mm.

An area for the free passage of moist air is defined as being the section through which air to be treated can pass freely at the absorbing material. Preferably, the area of the free air passage is equal to at least $1/10^{th}$ of the product of the active width of the absorbing material and the distance between the wall of the box and the occultation part 14.1 or the inner part 18, when such a part is used, throughout the life of the product taking account of the variation in the volume of the absorbing material. The absorbing material may be in the form of porous or blown pellets.

The inner part 18 may mechanically retain the absorbing material.

One or more thermal insulation materials (not shown) may also advantageously be provided between the absorbing material and the wall of the box to protect the material.

Since the attachment parts 14.2 and the occultation part are made in a single piece, they are also doubled up, the attachment of the cover onto the box is then made at the connection parts 20 between the two attachment parts 14.2. Preferably, the connection parts 20 are solid, which improves dissipation of the flux in the wall 4 of the box and therefore further protects the absorbing material from the heat flux. Furthermore, the attachment of the cover to the wall 4 will be facilitated. The attachment may for example be made by spot welding, gluing, riveting, welding or click-fitting. A cover in which for example the inner part 18 is made separately and then fixed to the occultation part is not outside the scope of this invention.

In the example shown, the cover has open side edges 14.3. Advantageously, there are lateral retaining means for the absorbing material. For example, there are bars 22 fixed to the attachment parts 14.2.

These lateral retaining bars may be made in a single piece with the cover. Preferably, lateral retaining means are such that they provide a large cross-sectional area for air circulating between the box and the zone between the cover and the absorbing material.

As a variant, it would also be possible to envisage orienting the cover in FIGS. 2A to 2C such that the attachment parts 14.2 are located laterally.

Furthermore, the cover can also be made by stamping and then drilling or stamping to make the circulation holes. In the case of a double wall cover, it would be possible to make two corresponding forms by stamping with different depths and then to nest one inside the other.

FIGS. 3A to 3E show another example embodiment of a management device according to the first embodiment in which the control material is located on an inside face of the box.

In this example embodiment, the management device comprises a cover 114, an absorbing material 112 and means to retain the absorbing material on the box.

In this example, the cover 114 comprises a single wall. It comprises an occultation part 114.1 formed from a part 114.1' approximately parallel to the wall of the box and inclined top and bottom parts 114.1". The end parts 114.1" may comprise windows for circulation of the flux and/or the occultation part may be such that there is a clearance between the free ends of inclined parts 114.1" and the wall of the box, the window and/or the clearance being such that the absorbing material remains protected from the solar flux.

The use of means to retain the absorbing material prevents contact between the occultation part and the absorbing material. In the example shown, the retaining means 116 comprise a portion 116.1 designed to come into contact with the material and to retain it, and two portions 116.2 folded perpendicularly relative to the portion 116.1 that will hold the cover 114 at a distance from the material, thus protecting the material if the module does not operate in a nominal manner. The portion 116.1 also fixes the retaining means 116 on the wall 4, for example by welding, spot welding or riveting of the longitudinal ends 116.

Advantageously, the retaining means 116 also fix the occultation part on the box, and to achieve this, each portion 116.2 comprises a folded free end 116.3 fixed to the inside face of the occultation part 114.1, for example by welding, gluing, etc. As a variant, it would be possible to envisage that the occultation part is fixed to the box directly, the folded parts 116.2 simply maintaining a clearance between the occultation part and the absorbing material.

The retaining means 116 are advantageously made by folding a sheet metal strip.

Figure 3A:
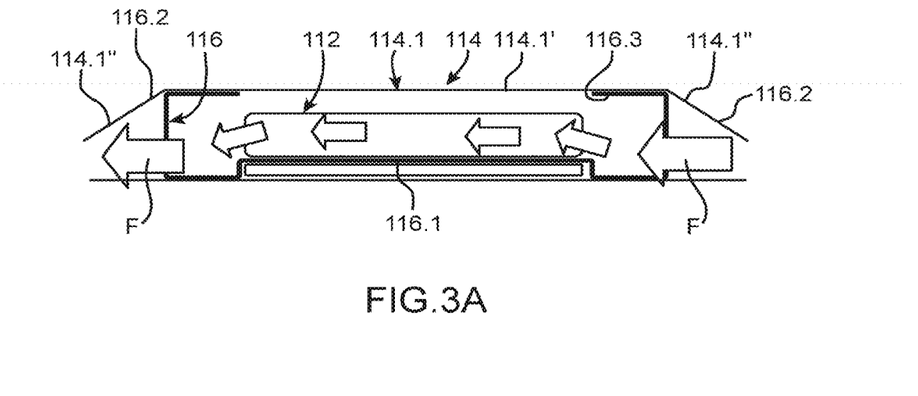
FIG. 3A is a sectional view of a part of another example embodiment of a module according to the first embodiment of the invention.
Figure 3B:
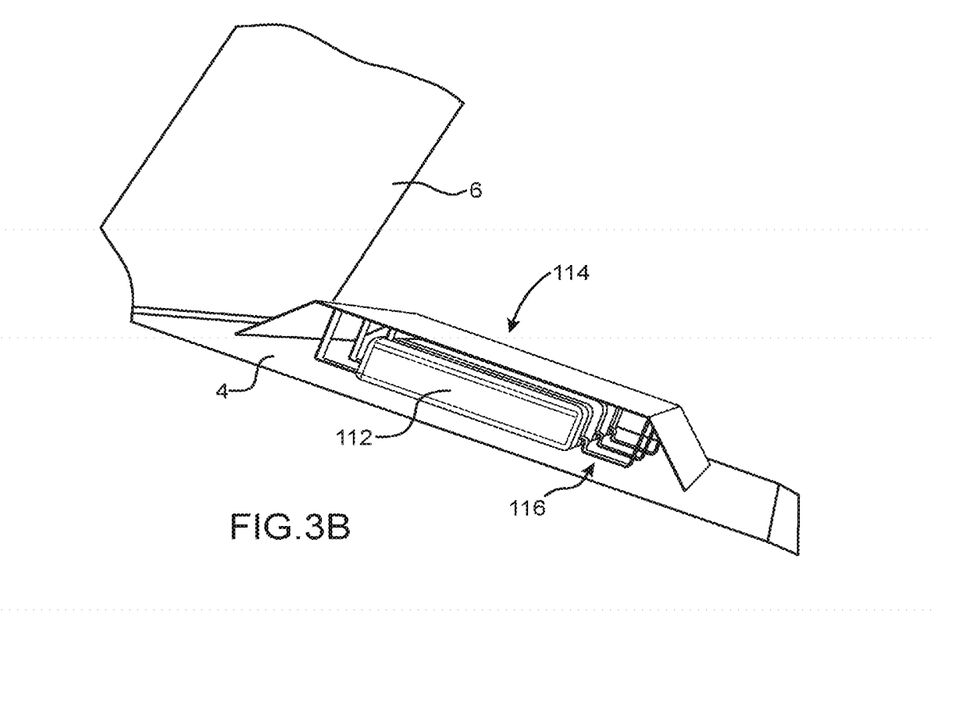
FIGS. 3B and 3C are perspective views from two points of view of the humidity management device in FIG. 4A.
Figure 3C:
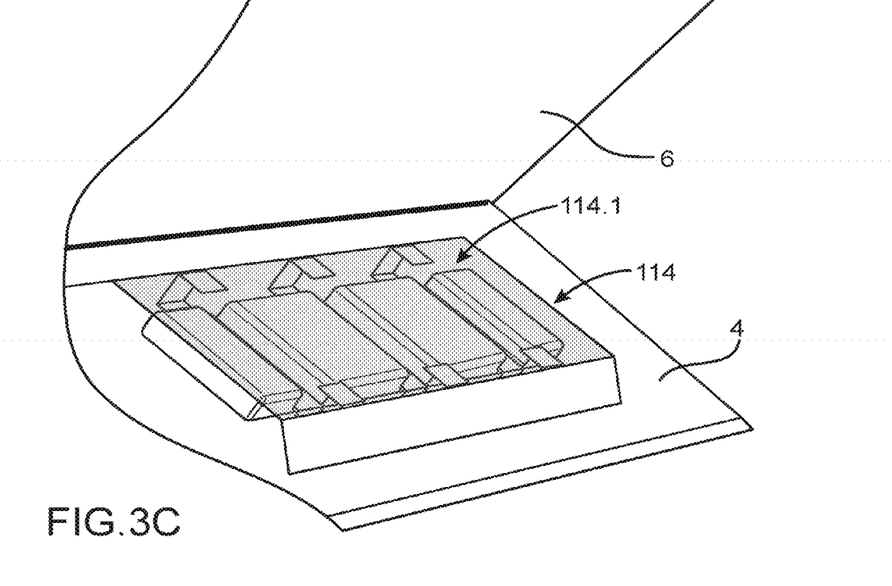
Figure 3D:
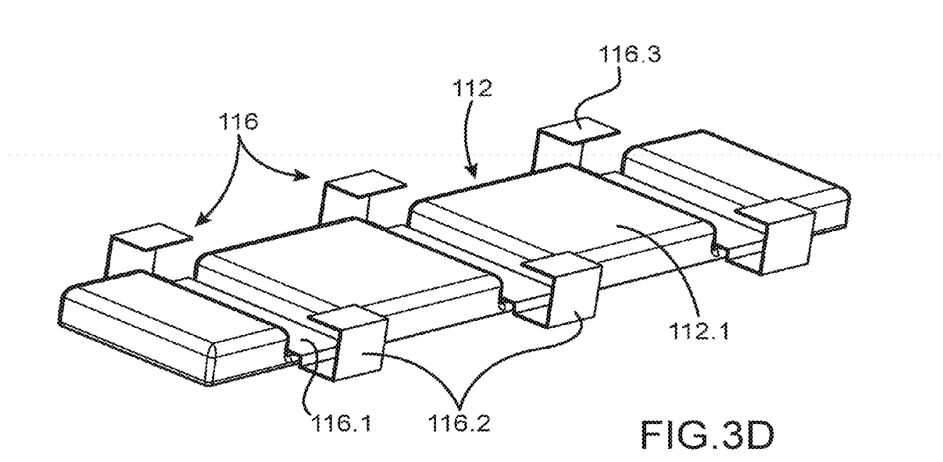
FIGS. 3D to 3F are perspective views of various elements of the humidity management device in FIGS. 3A to 3C.
Figure 3E:
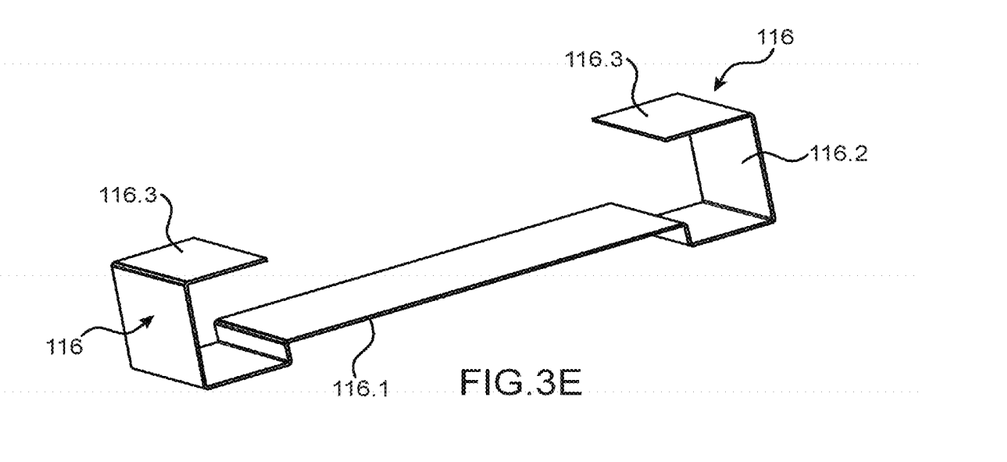
Figure 3F:
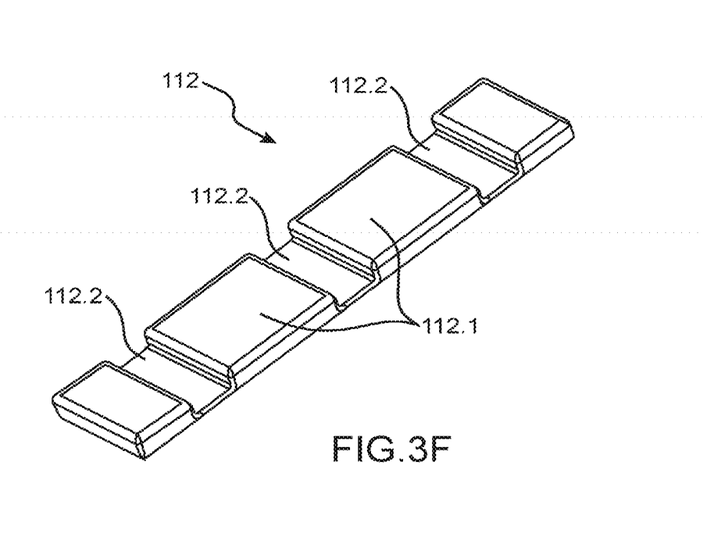

Several retaining means are used, as can be seen in FIG. 3B. Retaining means are placed at a distance from each other, so as to form a free passage to maintain contact between the air flow and the absorbing material.

In the example shown, the absorbing material 112 is formed so as to have compartments 112.1 separated by zones without absorbing material 112.2 with which retaining portions come into contact. This shape of the absorbing material is in no way limitative, the absorbing material could have an approximately constant thickness, the bearing portions 116.1 are then shaped accordingly. For example, the bearing portions could have a curved shape facing the absorbing material. This variant makes it possible to use an absorbing material without compartments.

Preferably, the surface of portions maintaining contact with the material is small to reduce heat exchanges between the occultation part and the material and thus prevent deterioration of the material.

Advantageously, one or several thermal insulating materials could be provided between the absorbing material and the retaining portions 116.1. Advantageously, one or several thermal insulating materials could also be provided between the absorbing material and the box.

This embodiment does not require any lateral retaining means.

As a variant, the retaining portions may be oriented perpendicular to the air flow or at another angle.

As a variant, it would be possible for the absorbing material to have no compartments, the retaining means would be facing the absorbing material. In this variant, it would be possible for the retaining portions 116.1 to include holes or windows in the folded portions 116.2.

Preferably, the height of the management device is such that it does not intercept the concentrated solar flux from the optical system, for example the Fresnel lens, to the cell that makes the photoelectric transformation.

As for the device in FIGS. 2A to 2C, in one preferred embodiment, the humidity management device in FIGS. 3A to 3F does not have any communication with the outside environment.

Figure 4A:
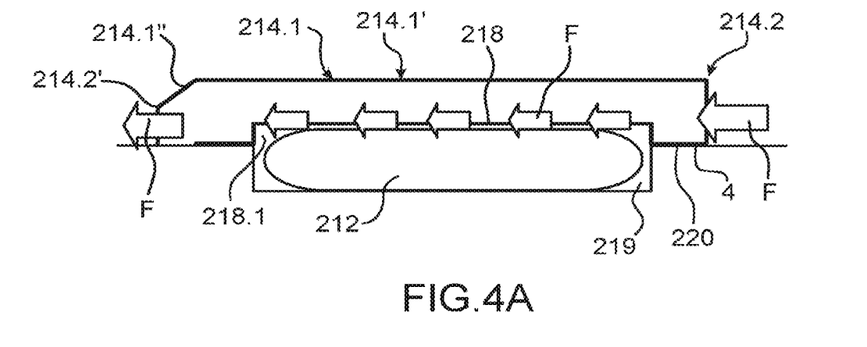
FIG. 4A is a sectional view of a part of another example embodiment of a module according to a second embodiment of the invention.
Figure 4B:
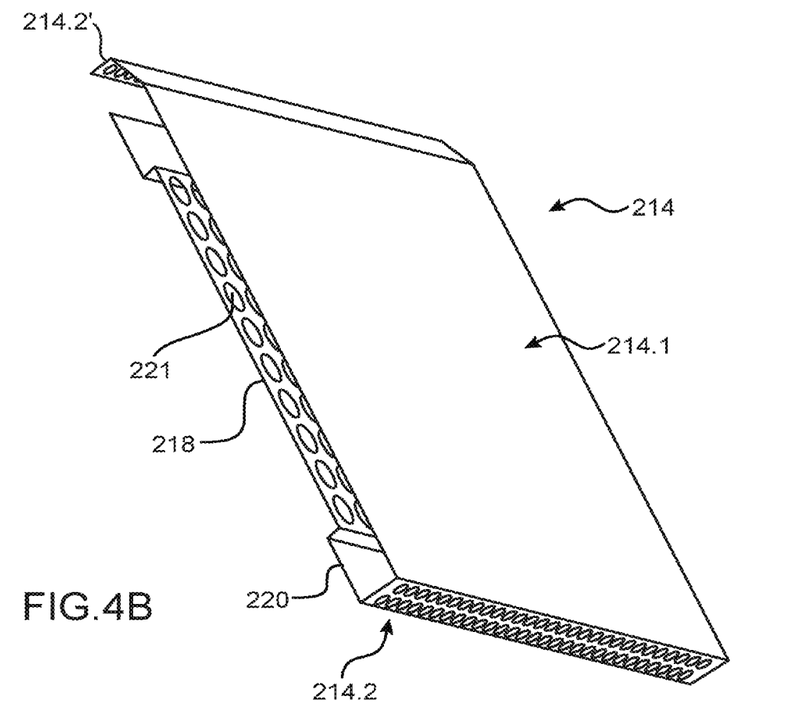
FIG. 4B is a perspective view of the humidity management device in FIG. 4A.

FIGS. 4A and 4B show an example of a management device according to a second embodiment. This second embodiment is different from the first embodiment in that the absorbing material is located partly in the volume of the box and partly in a housing formed in a wall of the box. This embodiment has the advantage that the size of the device is partly transferred outside the inside volume of the box.

Preferably, at least 10% of the absorbing material is contained inside the box and therefore not more than 90% of the absorbing material is contained in the housing formed in the wall.

The management device comprises a cover 214, an absorbing material 212 and a receptacle 219 formed by stamping in a wall of the box, the side wall 4 in the example shown. The absorbing material is housed in a housing delimited by the receptacle and the cover 214. For example, the depth of the stamped part is between 20 mm and 25 mm.

The shape of the cover 214 is similar to the shape of the example shown in FIGS. 2A to 2C.

The cover comprises an occultation part 214.1 approximately parallel to the box and an attachment part 214.2 that will fix the cover onto the box.

In this example, the attachment part 214.2 is located at the end of the cover 214 through which the flux enters.

The dimensions of the cover are such that a non-zero distance is formed between the absorbing material and the occultation part. The occultation part 214.1 is solid and will protect the absorbing material from concentrated solar rays.

In the example shown, the occultation part 214.1 has a part 214.1' with a large area approximately parallel to the side wall and an inclined part 214.1" prolonging the protection of the material. In the example shown, the inclined part 214.1" is prolonged with a part 214.2' perpendicular to the side wall in which holes are formed for evacuation of the flow. The attachment part 214.2 is designed to attach the cover onto the side wall, but also so as to enable an air flow to be set up between the cover and the absorbing material, this air flow being represented by arrows F and circulating from the bottom part of the management device towards its upper part. As a variant, the part 214.2' may be omitted if the occultation parts 214.1' and/or 214.1" are sufficient to efficiently protect the absorbing material from fluxes derived from focussing being lost.

The air flow is caused by natural convection shown diagrammatically by the arrows 38 in FIG. 1.

The attachment part 214.2 is then perforated to enable air flow. In the example shown, holes 216 are formed in the attachment parts. It will be understood that the attachment part could be made differently to make the communication between the occultation part and the box and to allow air passage. As a variant, it could comprise windows or it could be formed by racks. In the example shown, the number of holes at the outlet attachment part is less than the number at the inlet attachment part, but this is in no way limitative. The number of holes and/or the passage area of these holes could be identical or larger without going outside the scope of this invention.

Advantageously the occultation part 214.1 and the attachment parts 214.2 are made in a single piece by bending a plate.

As shown and also advantageously, the cover is made so that it has a double wall. In particular, the cover comprises an inner part 218 at a distance from the occultation part. An air film present between the occultation part 214.1 and the inner part 218 represents the passage area close to the active surface of the absorbing material, for air located in the box in which humidity is to be controlled. It also provides thermal insulation.

In the example shown, the inner part 218 comprises a cavity 218.1 that, together with the receptacle stamped in the box, delimits the housing of the absorbing material, the absorbing material being held in place between the bottom of the receptacle and the bottom of the cavity.

Preferably, the inner part 218 comprises openings 221, for example drillings, through which air can circulate between the occultation part and the inner inlet part in contact with the absorbing material. As a variant, the inner part could be formed by strips separated from each other such that the absorbing material is accessible for air or any other structure.

One or several thermal insulating materials can also advantageously be provided between the absorbing material and the wall of the box in order to protect the material.

Due to the preferred embodiment making use of a single-piece part, the attachment part is also doubled up, the attachment of the cover on the box is then made at the connection part 220 between the two attachment parts 214.2. The cover is preferably fixed onto the side wall at the two longitudinal ends of the inner part on each side of the receptacle 219. Preferably, the connection part 220 is solid. The attachment may for example be made by spot welding, bonding, riveting, welding or click-fitting.

As a variant, it would be possible to have a closed structure, in which the inner part 218 would be connected to the part 214.2' through a connection part 220.

Preferably, the distance between the occultation part 214.1 and the inner part 218 is at least 2 mm.

In this second embodiment, the area of the free air passage is preferably equal to at least $\frac{1}{10}^{th}$ of the product of the active width of the absorbing material and the distance between the bottom of the receptacle and the occultation part 214.21 or the inner part 218 when such a part is used, throughout the life of the product taking account of the variation in the volume of the absorbing material. The absorbing material may be granular, porous or blown.

It will be understood that a cover with a single wall forming the occultation part 214.1 is not outside the scope of this invention.

As for the device in FIGS. 2A to 2C, in one preferred embodiment, there is no communication between the humidity management device in FIGS. 4A and 4B and the outside environment.

Figure 5A:
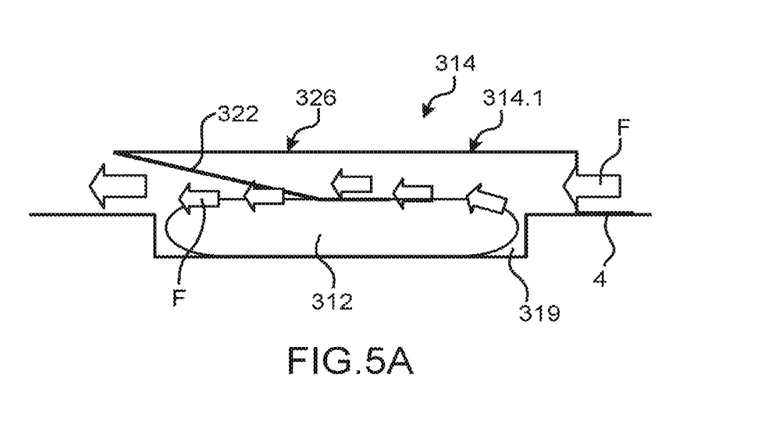
FIG. 5A is a sectional view of a part of another embodiment of a module according to the second embodiment of the invention.
Figure 5B:
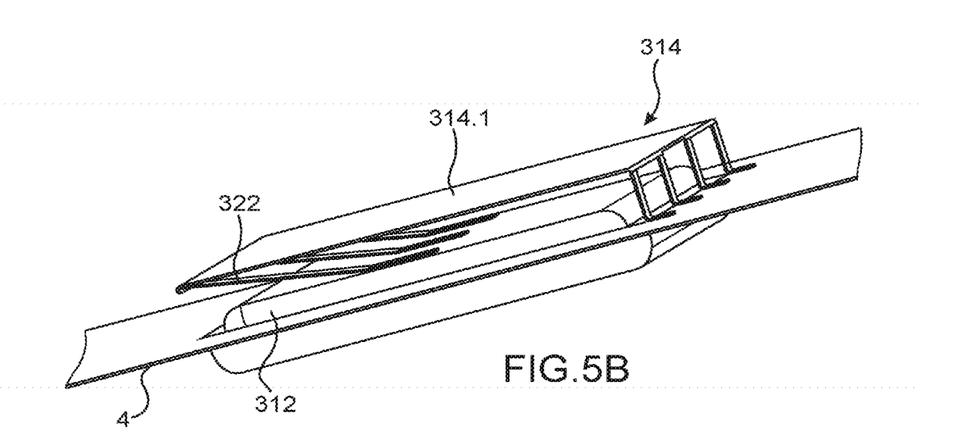
FIG. 5B is a perspective view of the humidity management device in FIG. 5A.

FIGS. 5A and 5B show another example embodiment of a management device according to the second embodiment. The management device comprises a cover 314, an absorbing material 312 and a housing 318 made by stamping in a wall of the box, the wall is a side wall in the example shown.

The cover 314 comprises an occultation part 314.1 and an attachment part 314.2 to the side wall.

In the example shown, the occultation part 314.1 has a plane shape approximately parallel to the wall. The profile of the attachment part is L-shaped, of which the base is fixed to the wall and the free end of the vertical part and connected to the occultation part. Preferably, several L-shaped elements are located transversally at a distance from each other forming a passage between them for the air flow. A single L-shaped strip extending over a large part of the width of the occultation part with holes or windows is not outside the scope of this invention.

Advantageously, retaining means 320 are provided for the absorbing material. In the example, these means 320 are formed from at least one strip 322 fixed to the occultation part and arranged between the occultation part and the absorbing material. The strip is folded so as to apply a force on the material towards the bottom of the housing 319. Preferably and as shown, the retaining means comprise several strips distributed across the width of the cover at a distance from each other, forming a passage for the air flow between them. If a single strip is used, it will preferably be perforated.

Very advantageously, the strip(s) 322 is (are) made in a single piece with the occultation part and with the attachment elements. The cover is advantageously made by bending.

This (these) strip(s) is (are) folded so as to form a spring effect that keeps the material permanently in position despite variations in the volume of the absorbing material. Preferably the strips are coated with a thermal insulation material at zones bearing in contact with the absorbing material.

Side walls of the stamped housing retain the material laterally, avoiding the need to use additional lateral retaining means.

As can be seen for the device in FIGS. 2A to 2C, in one preferred embodiment, the humidity management device in FIGS. 5A and 5B does not include any communication with the outside environment.

It will be understood that the different example embodiments can be combined. For example, the use of retaining means 116 shown in FIGS. 3A to 3F could be envisaged in management devices shown in FIGS. 2A to 2C or in FIGS. 4A and 4B.

The retaining strips in FIGS. 5A and 5B may be used in the device shown in FIGS. 2A and 2B.

The cover and the retaining means are advantageously made from a material that is a good heat conductor, for example aluminium or an aluminium alloy. Steel or alloys could also be used.

We will now describe the absorbing material. For example, it may be a silica gel, a molecular sieve made from zeolite, montmorillonite type clay, active alumina, or calcium sulphate.

Very advantageously, the absorbing material is an absorbing and humidity-regulating material which has the effect of maintaining a given humidity.

Such materials have variable absorption capacities and functional reversibilities. The term <<reversibility>> refers to the capacity of the chemical compound to absorb and desorb water vapour under given temperature conditions.

For example, the maximum relative humidity that prevents the appearance of condensation has been estimated at about 40%. Humidity regulation about this value and variation amplitudes between 30% and 50% can maintain such a relative humidity. For example, calcium chloride has the ability to regulate the relative humidity to between 40% and 50% (at a temperature of 20° C.).

The material may for example be in the form of powder, pellets, beads or a gel.

The absorbing material may be arranged in a container. This container is preferably flexible, and is such that it can accommodate variations in the volume of the material. For example, the container is a bellows bag 32 like that shown in FIG. 5. The bag may also have one face made from a watertight material, for example a plastic film, and one face made from a material permeable to water vapour of the breathing membrane type. The permeable membrane forms the active surface of the bag and it will be oriented such that it is on the inside of the box.

Different natures of materials can be used with the management device according to the invention. Therefore, it can be adapted to any available dehydrating agent or moisture absorber.

The quantity of absorbing material is chosen as a function of the estimated operating time and hygrometric conditions on the installation site. For example, for a box volume of about 400 liters in a continental climate, a mass of about 1 kg of calcium chloride will be required for operation for a period of 15 years.

Operation of the management device will now be described with reference to FIG. 1.

In FIG. 1, air movements by natural convection are represented by the arrows 38.

The representation chosen is at the end of the night and the beginning of the morning, the time at which the temperature of the top wall 6 of the box composed of lenses is lowest and could drop below the dew temperature. Local cooling takes place close to the serrated microstructure of the Fresnel lenses at the primary optics and originates from heat losses due to thermal radiation to the sky during the night. Furthermore, the low optical absorptivity and high transmissivity of lenses prevent incident solar flux from heating the air locally.

On the other hand, the bottom wall 8 comprising the photovoltaic cells is affected by local heating due to the action of heat sinks and the bottom plate that are affected by local air movements at ambient temperature.

Therefore, there is a temperature gradient in the volume inside the module that induces transfers of air mass that govern air convection mechanisms. Furthermore, moist air is lighter than dry air.

Therefore, air flows take place close to the box containing the absorbing material, as symbolised by the arrows 38.

Therefore, there is a humid air flow from the bottom towards the top between the occultation part and the absorbing material 12. Water vapour contained in air is absorbed by the absorbing material through the permeable membrane. Air that leaves is then dried.

The volume of the absorbing material increases as it absorbs water vapour, and the envelope expands to adapt to the volume of the absorbing material.

If a humidity regulating absorbing material is used, the material regenerates itself during the day when the temperature in the box is sufficiently high, by releasing water vapour into the box and keeping the value of the humidity in the box approximately constant.

The box may also comprise a vent closed off by a breathing membrane, allowing air and water vapour to pass through but not liquid water.

A module may comprise one or several humidity management devices depending on the air volume in the module.

In the example shown in FIG. 1, the box comprises four plane side walls. A box with a tapered side wall is within the scope of this invention.

The humidity management device is absolutely passive, and thus the global energy efficiency of the system is not degraded. It is also self-contained, it has excellent reliability in the long term and its life is longer with little or no maintenance.

It uses few parts and their assembly is relatively easy. In particular, in the case in which a single-piece solution is used, only the cover is made from a plate by cutting, bending and perforation, and is then simply fixed to the wall, the wall possibly but not necessarily having been previously stamped.

Therefore, the production cost is low.

The device is also relatively compact and can easily be installed in an existing solar module. Furthermore, it does not interfere with the solar flux during nominal operation, and thus does not reduce the efficiency of the module.

This invention simultaneously:
- protects the absorbing material from concentrated solar flux caused by non-nominal operation of the optical system, for example when the concentrated solar flux is badly aligned due to incorrect operation of the tracker;
- does not transmit heat flux between the solar flux occultation part (derived from unconventional operation of the optical system) and the absorbing material;
- circulates air close to the absorbing material, the absorbing material remaining accessible to convection movements inside the box.

Furthermore, the absorbing material may be mechanically retained such that the integrity of the absorbing material is not compromised, and particularly if a bag is used, there is no risk of tearing or compression, in particular considering variations in the volume of the absorbing material due to absorption of moisture. On the other hand, contacts between the absorbing material and the retaining means can be minimised in order to reduce transmission of heat to the absorbing material.

Figure 6:
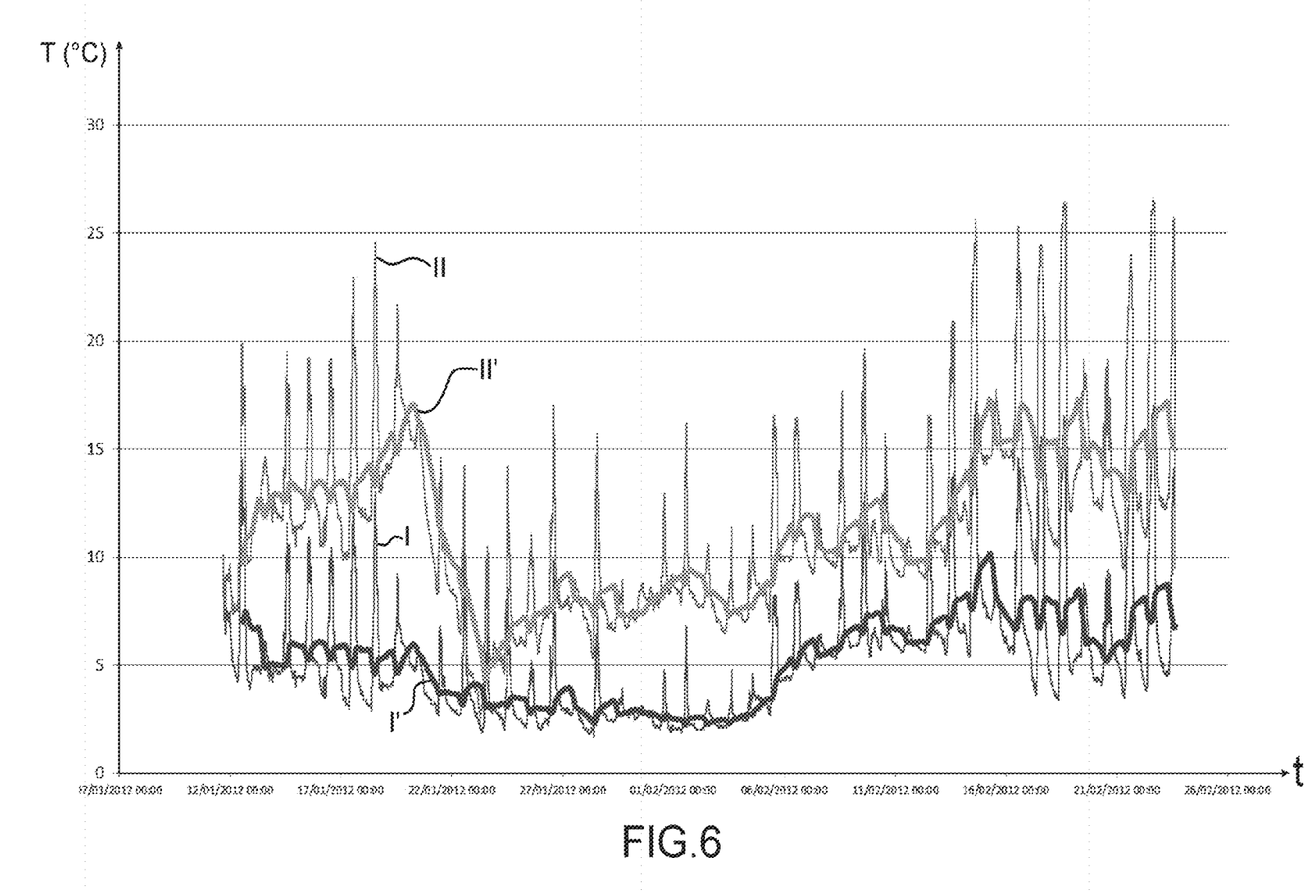
FIG. 6 is a graphic illustration of the temperature difference between the temperature of air contained in the module and the dew temperature of this air as a function of the time divided into day for a module with a humidity management device according to the invention and a module without a humidity management device.

Curves I and II in FIG. 6 show temperature differences $\Delta T$ in ° C. between the box air temperature and the dew temperature of the same air, as a function of the time divided into day, for a module without a management device according to the invention and for a module with a management device according to the invention. Curves I' and II' show the moving average of curves I and II respectively.

The risk of condensation occurring reduces as the temperature difference increases, knowing that the lens temperature in the early morning is a few degrees lower than the air temperature in the box, due to radiation from the lens to the sky, for example from 2° C. to 5° C. with a clear sky. Thus, considering temperature differences shown by curve II, if it is assumed that the lens temperature is 2° C. to 5° C. below the air temperature in the box, it still remains very much higher than the dew temperature.

Therefore, the efficiency of the management device according to the invention is quite clear.

Figure 7:
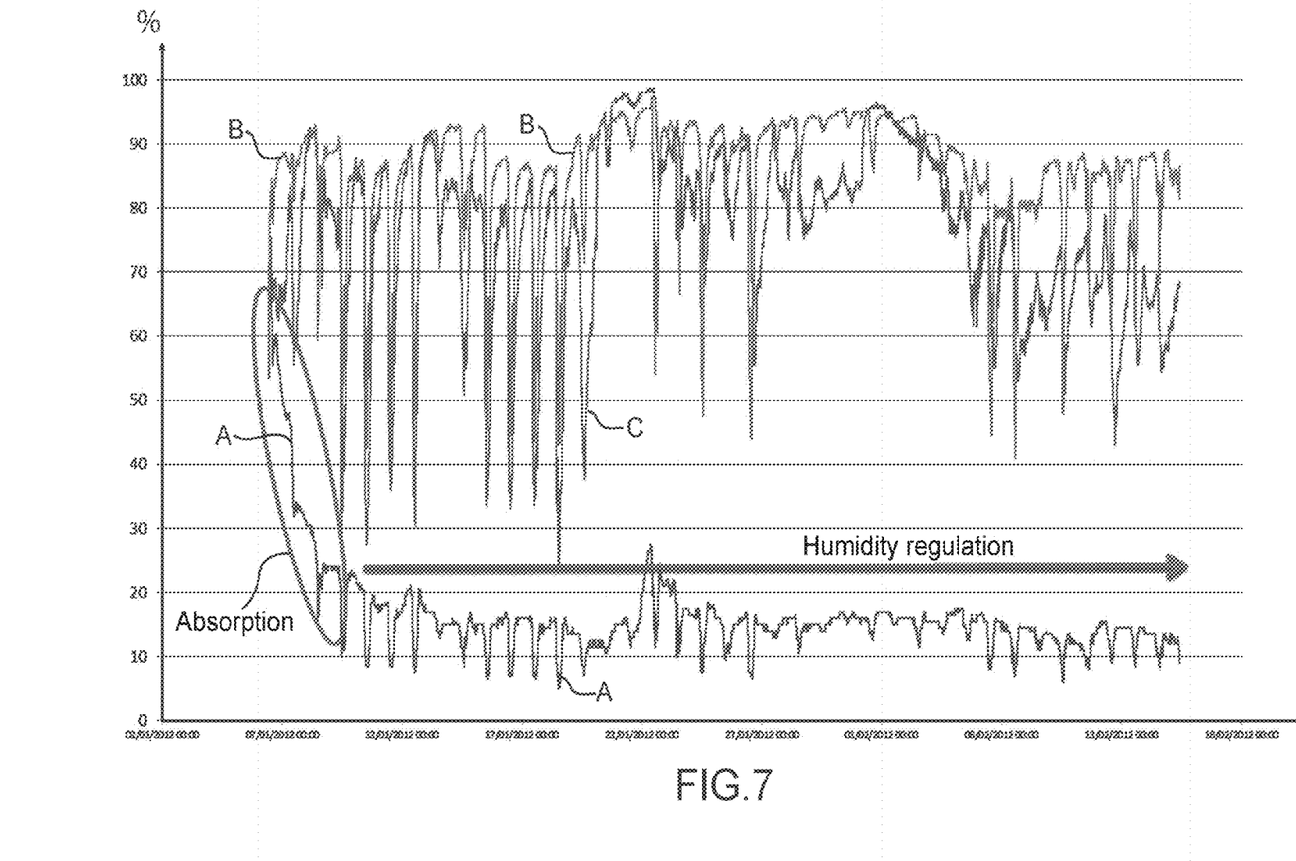
FIG. 7 is a graphic illustration of the variation of the relative humidity % of air contained in a module with a humidity management device according to the invention and the variation in the relative humidity % of air contained in a module without a humidity management device, under the same operating conditions.

FIG. 7 shows a graphic illustration of the variation of the relative humidity % of air contained in a module with a humidity management device according to the invention (curve A) and the variation of the relative humidity % of air contained in a module without a humidity management device according to the invention (curve B). Curve C shows the relative humidity of the outside environment.

Curve A shows a first moisture absorption step up to the regulation range, and a second moisture regulating step inside the box is then observed relative to the different water vapour inputs, for example such as diffusion through the joints, poor seal, in some cases breathing membrane, etc. Curve B shows that the relative humidity in the box is approximately the same as the relative humidity outside the box.

The solar module according to the invention can be used in all concentrating solar systems and it is particularly suitable for use in concentrating solar systems with Fresnel lenses.

The invention claimed is:

1. A concentrating solar module comprising:
   a box comprising an upper bottom comprising an optical system, and walls, at least one first wall among the walls comprising a principal part contained in a plane;
   at least one photovoltaic cell placed in the box; and
   at least one humidity management device comprising a moisture-absorbing material, a housing defined between the first wall and an occultation device fixed to the first wall, the moisture-absorbing material positioned in the housing such that at least part of the moisture-absorbing material is located on one side of the plane containing the occultation device, the occultation device being arranged facing the moisture-absorbing material to form a passage between the occultation device and the moisture-absorbing material and such that air contained in a volume of the box circulates in passage between the occultation device and the moisture-absorbing material and returns into a volume of the box.

2. A solar module according to claim 1, wherein the housing is defined by the principal part of the first wall, the moisture-absorbing material being entirely located on a same side of the plane.

3. A solar module according to claim 1, wherein the first wall comprises a part formed by a depression, the depression combined with the occultation device defining the housing, the moisture-absorbing material being partly contained in the depression.

4. A solar module according to claim 3, wherein the depression is made by stamping.

5. A solar module according to claim 1, wherein the box comprises at least one side wall and a lower bottom opposite the upper bottom, the first wall being formed by the lower bottom wall.

6. A solar module according to claim 1, wherein the box comprises side walls and a lower bottom opposite the upper bottom, the first wall being formed by one of the side walls.

7. A solar module according to claim 1, wherein the humidity management device comprises a cover supporting the occultation device, the occultation device being formed at least by an occultation plate.

8. A solar module according to claim 7, wherein the cover comprises parts for fixing the occultation plate to the first wall, the occultation plate being solid and the attachment parts being perforated to enable an air flow to be set up between the occultation plate and the moisture-absorbing material.

9. A solar module according to claim 7, wherein the cover comprises at least one occultation plate that will collect the solar flux and an inner part facing the moisture-absorbing material, a space being arranged between the inner part and the occultation plate.

10. A solar module according to claim 9, further comprising a thermal insulation material other than air provided between the occultation part and the inner part.

11. A solar module according to claim 9, wherein the inner part is perforated to allow air located in the space between the inner part and the occultation plate to come into contact with the moisture-absorbing material.

12. A solar module according to claim 9, wherein the inner part applies a force on the moisture-absorbing material towards the first side wall.

13. A solar module according to claim 12, wherein the inner part is formed from strips fixed at a longitudinal end to the occultation plate and bears in contact with the moisture-absorbing material.

14. A solar module according to claim 8, wherein the cover comprises at least one occultation plate that will collect the solar flux and an inner part facing the moisture-absorbing material, a space being arranged between the inner part and the occultation plate and in which the occultation plate, the inner part, and the attachment parts are made from a single piece.

15. A solar module according to claim 8, wherein the cover comprises at least one occultation plate that will collect the solar flux and an inner part facing the moisture-absorbing material, a space being arranged between the inner part and the occultation plate and the attachment part form retaining means of the moisture-absorbing material.

16. A solar module according to claim 15, wherein at least one thermal insulation material is provided between the moisture-absorbing material and the retaining means.

17. A solar module according to claim 1, wherein at least one thermal insulation material is provided between the moisture-absorbing material and the first wall.

18. A solar module according to claim 9, wherein a distance between the first wall of the housing and an inner face of the inner part is equal to at least 2 mm and a free air passage area is equal to at least 10% of the product of an active width of the moisture-absorbing material and the distance between the part of the first wall of the housing and an inner face of the cover.

19. A solar module according to claim 8, wherein the cover comprises at least one occultation plate that will collect the solar flux and an inner part facing the moisture-absorbing material, a space being arranged between the inner part and the occultation plate.

* * * * *